United States Patent Office 3,490,965

Patented Jan. 20, 1970

3,490,965

RADIATION RESISTANT SILICON SEMICONDUCTOR DEVICES

James E. Webb, Administrator of the National Aeronautics and Space Administration, with respect to an invention of Joseph J. Wysocki, Princeton Junction, N.J.

No Drawing. Filed May 17, 1967, Ser. No. 640,452
Int. Cl. H01l 7/44
U.S. Cl. 148—188 10 Claims

ABSTRACT OF THE DISCLOSURE

The herein disclosed process includes forming a P/N junction in a high-resistivity, floating-zone purified N-type silicon body having a low oxygen content and a low donor impurity concentration. Lithium is then added by diffusion doping at temperatures as low as 300–500° C., for example, and the product is further heated if necessary to diffuse the lithium through the N region of the product. Finally, contacts are added to the structure. Alternatively, the oxygen content of the silicon does not have to be low; neither does the resistivity have to be low. However, after a thusly formed product has been exposed to radiation it loses some of its radiation resistance and must be annealed to regain it.

In recent years, the silicon semiconductor device has come into widespread use in electronic technology; whether the semiconductor device is a solar cell, a transistor, a diode, or other device, it has found increasing application. The silicon semiconductor device is particularly useful in extreme environments where weight and size are factors; particularly, the environment of space. That is, silicon semiconductor devices are widely used as solar cells in space vehicle electric power systems; as amplifying devices in space vehicle telemetry systems; and as switching devices in space vehicle computers. Because silicon devices are small and extremely rugged, they are exceptionally adaptable to the space environment.

While silicon semiconductor devices have been widely used in modern electronics and particularly, space electronics, their operation has not always been entirely satisfactory. That is, silicon semiconductor devices, as well as other semiconductor devices, have been found to be very susceptible to destruction by certain types of high energy radiation, such as the radiation generated in the well-known Van Allen belt. Apparently, the bombardment of semiconductor devices by high energy radiation destroys the crystal lattice structure of the device resulting in progressively decreased operativeness until complete failure occurs. As best understood, the radiation destroys the semiconductor by removing an atom from the crystal lattice structure to create a vacancy in the structure. This vacancy or combination of the vacancy with impurities acts as an electron trap to prevent the desired flow of electrons through the body of the device. When enough of these traps or vacancies have been created, they halt current flow and the device is rendered useless.

To reduce the radiation problem, the prior art has normally shielded semiconductor devices. That is, the transistors and diodes used in a spacecraft are mounted inside of a shielded structure. The solar cells of a space vehicle, which are mounted on the exterior of the vehicle, have been protected by transparent shields usually made of quartz or sapphire. In both cases, the shielding reduces the damage created by radiation, but does not eliminate it. Moreover, these shields add "dead" weight to the associated space vehicle.

Therefore, it is an object of this invention to provide a new and improved radiation-resistant silicon semiconductor device.

It is also an object of this invention to provide a new and improved silicon semiconductor device that does not require additional shielding to protect it from radiation.

It is another object of this invention to provde a new and improved process for making radiation resistant silicon semiconductor devices.

It is a still further object of this invention to provide a new and improved process that is simple and uncomplicated for making radiation resistant silicon semiconductor devices.

In accordance with a principle of this invention, the introduction of lithium into a highly resistive, lowly doped, N-type silicon body having a low oxygen content, improves the radiation resistance of the body.

According to a further principle of the invention, a wafer of silicon of the foregoing type is polished on one surface and then doped to create a P/N junction. The unpolished surfaces are cleaned and lithium is diffused by heat into the N region. The wafer is then cooled and dipped into water to remove the excess lithium. Finally, the wafer is again heated to diffuse the lithium through the N region to the P region. The end result is a P/N junction device that has high radiation-resistance.

It is conjectured that these improved results occur because the lithium atoms are smaller than the silicon atoms and because they do not enter into a chemical bond with the silicon atoms whereby they are left free to roam through the crystal structure of the wafer in the manner of a gas. Hence, when high energy particles burst into the silicon lattice structure and knock the silicon atoms out of position the lithium atoms fill the gap. Thus, the lithium atoms prevent the gap from becoming an electron trap and degrading the performance of the device. In this manner, the invention provides a "self-healing" radiation resistant device.

In accordance with a still further principle of the invention, if the initial wafer or body has a lower resistivity and a higher oxygen content than the preferred wafer, the radiation resistance of the device can still be improved by the introduction of lithium in the manner hereinabove described. However, after the device is exposed to radiation it loses some of its radiation resistance and must be annealed to regain it. The annealing may be performed by heating the body to a moderate temperature.

The invention provides a simple process for improving the radiation resistance of an N-type silicon semiconductor device. The device can be a P/N type solar cell, a PNP transistor, a PN diode, or other semiconductive device. The process of the invention requires that the main body of the device be formed of N-type silicon semiconductor material. The introduction of appropriate dopant materials in any conventional manner to predetermined areas of the body creates the desired transistor, diode, solar cell, or other device. Introducing lithium into the doped device and diffusing it through the device in the inventive manner results in improving the radiation resistance of the device. Preferably, the initial body of N-type silicon semiconductive material has high resistivity and low oxygen content. Further, the initial wafer is preferably lightly doped to create the N or donor properties of the wafer. However, the initial wafer can have a medium resistivity and a medium oxygen content. But, for the latter case the device must be annealed after it has been exposed to radiation to regain its radiation resistance.

In addition to the novel process of the invention, it will be further appreciated that the product formed by the process is unique. That is, the introduction of lithium into an N-type silicon semiconductive material forms a radiation resistant product.

The foregoing objects and many of the attendant advantages of this invention will become more readily appreciated as the same becomes better understood from the following detailed description. For illustrative purposes, the description is of a silicon solar cell; however, the described process is equally suitable to the formation of other radiation resistant silicon semiconductor products.

In accordance with the preferred process of the invention a wafer of silicon is highly purified by the well-known float-zone process, for example until it has an oxygen content of about $10^{15}$ oxygen atoms or less per cm.$^3$. The thickness and resistivity of the wafer are preferably 15–20 mils. and 10 ohm-cm., respectively.

A limited amount of phosphorous or some other suitable donor impurity is then introduced into the wafer. The exact amount of the phosphorous impurity will vary with the type of device being created; however, it is preferably $2 \times 10^{14}$ atoms or less per cm.$^3$.

Before forming a P/N junction in the device, one face of the wafer is either mechanically or chemically polished. Since polishing processes are well known in the art they will not be discussed here. Following the polishing step, the P/N junction is introduced into the device. The P region is formed by heating the wafer and passing boron nitride vapor over it, for example. By heating the wafer to a temperature of about 975° C. and maintaining the passage of boron nitride over it for about one half hour, P/N junctions form beneath both major faces of the wafer. The diffused P region is then removed from the unpolished face of the wafer by etching or lapping.

Lithium is now introduced into the N region. One method of performing this step is to prepare a thick lithium paste by suspending lithium in mineral oil and to paint this paste onto the etched or lapped surface of the wafer. The wafer is then heated to 400° C. for approximately one half hour so that the heat diffuses some of the lithium into the N region of the wafer.

It is to be understood that the temperature of 400° C. and time of one half hour are by way of example and are not to be considered a limitation on the invention; they merely provide one suitable time and temperature. More specifically, since the end porduct and the environment in which it is to be used determine the amount of lithium that must be diffused, temperature and time must be chosen so as to diffuse the correspondingly proper amount of lithium from the lithium paste.

After the wafer is cooled, the excess lithium paste is removed by dipping the wafer in water, for example. Next, the wafer is reheated in a furnace or other suitable apparatus to approximately 400° C. for about one hour to diffuse the lithium through the entire N region and into the P region.

After the wafer has cooled, ohmic contacts are attached to the back and front surfaces of the wafer. The ohmic contacts may be made of silver and titanium, for example, and may be attached by evaporating separate layers of silver and titanium onto the surfaces to form a composite layer and then sintering the device at 600° for twenty minutes.

The end result of the foregoing process is a radiation resistant P on N solar cell. As a final step an antireflection coating may be added by evaporating silicon monoxide onto the P surface of the device.

While the foregoing has described the application of a lithium paste onto the lapped surface of the wafer, other suitable means for introducing lithium may also be used. For example, a lithium-tin alloy having up to about 1 weight percent lithium may be used. This alloy is applied to the wafer by heating the alloy until it melts and then dipping the wafer into the melted alloy and permitting it to remain there for from 24 to 48 hours. Lithium is taken out of the melt by the wafer and diffused through the wafer. After this treatment, the wafer is removed from the melted alloy and cleaned in hydrofluoric acid, for example, to remove traces of the alloy.

Another suitable means for applying the lithium to the device is to evaporate pure lithium onto the etched or lapped surface of the wafer and then heat the wafer to about 400° for from three to four hours. The heat diffuses the lithium into the wafer so that a radiation resistant product is formed.

The process of the invention can also be used to improve the radiation resistance of lower resistivity N-type silicon (10 ohm-cm. or less) having an oxygen content of greater than about $10^{15}$ oxygen atoms per cm.$^3$. For example, in order to improve the radiation resistance of an N-type silicon having $10^{16}$ to $10^{18}$ oxygen atoms per cm.$^3$, $10^{16}$ to $10^{18}$ atoms per cm.$^3$ of lithium must be introduced into the N region to combine with the oxygen atoms and create LiO donor combinations. More specifically, when N-type silicon contains $10^{16}$ to $10^{18}$ atoms per cm.$^3$ of oxygen, the dominant defect intoduced by radiation is the vacancy-oxygen complex. That is, the oxygen vacancy acts to trap electrons and degrade the operation of the devict. When lithium is added in an amount greater than or equal to the oxygen content the lithium combines with the oxygen to create LiO donors and prevent the oxygen vacancy from forming and trapping electrons. Hence the radiation resistance of the device is improved. However, it has been found that when these devices ($10^{16}$ to $10^{18}$ oxygen atoms per cm.$^3$) have been irradiated they must be annealed at a temperature of about 100° C. to bring them back to their initial radiation resistance.

In general these lower resistivity radiation resistant devices are made in the same manner as the higher resistivity devices. Specifically, after the P/N junction is formed, either a lithium paste is painted onto the device; or pure lithium is vacuum deposited onto the device in the manner described. The device is twice heated to 400° C. to diffuse the lithium into and through the device. Contacts are then applied. Thereafter, if the device is radiated by high energy particles and its properties are reduced, it can be returned to its initial condition by heating to about 100° C.

It will be appreciated by those skilled in the art and others that the foregoing has described a very simple process for making a radiation resistant semi-conductor solar cell. The introduction of lithium into a high resistivity N-type silicon material improves the radiation properties of the material. The lithium, in accordance with the theory of the invention, drifts through the device to fill vacancies that are created when a high energy particle destroys part of the crystal lattice structure. This lithium prevents the vacancy from becoming an electron trap to destroy the properties of the device. It has been found that an improvement of 20 to 100 times the radiation resistance of a conventional semiconductor device is created when high resistivity silicon having a low donor impurity and a low oxygen content is used as the basic wafer in a solar cell. However, if the oxygen concentration is greater and the resistivity of the device is lower, the radiation resistance can still be improved by the introduction of lithium in the manner described. When a device having lower resistivity and higher oxygen has lithium introduced into it, its operating ability can be reduced and destroyed. However, by reheating the device to a temperature of approximately 100° C., its initial operating ability can be reachieved.

It will be appreciated that while the foregoing specific description of the invention has described the invention as an improvement to semiconductor solar cells, the invention can be utilized on a wide variety of silicon semiconductor devices such as diodes, transistors and integrated circuits, for example. The basic requirements are: starting with an N-type silicon semiconductor material; doping it with appropriate dopants to create P/N junctions; and introducing lithium into the N region to create the radiation resistant end product. Hence, the invention may be practiced otherwise than as specifically described herein.

What is claimed is:

1. A process for making a radiation resistant silicon semiconductor device comprising the steps of:
   depositing lithium onto the N region of a silicon semiconductor;
   heating said body to diffuse a predetermined amount of lithium into said body;
   removing the excess lithium from said body; and
   reheating said body to diffuse the lithium through said N region.

2. A process as claimed in claim 1 wherein said lithium is deposited by painting a paste comprised of lithium suspended in mineral oil onto the N region.

3. A process as claimed in claim 2 including the step of creating a P/N junction in said body of semiconductor material prior to depositing lithium onto said N region.

4. A process as claimed in claim 3 wherein said body of silicon semiconductor material has a high resistivity and a low oxygen content.

5. A process as claimed in claim 1 wherein said lithium is deposited by vacuum deposition.

6. A process as claimed in claim 5 including the step of creating a P/N junction in said body of semiconductor material prior to depositing lithium onto said N region.

7. A process as claimed in claim 6 wherein said body of silicon semiconductor material has a high resistivity and a low oxygen content.

8. A process as claimed in claim 1 wherein said lithium is deposited onto said N region by dipping the body of silicon semiconductor material into a lithium-tin alloy in melted composition.

9. A process as claimed in claim 8 including the step of creating a P/N junction in said body of semiconductor material prior to depositing lithium onto said N region.

10. A process as claimed in claim 9 wherein said body of silicon semiconductor material has a high resistivity and a low oxygen content.

References Cited

UNITED STATES PATENTS 2,819,990 1/1958 Fuller et al. -------- 148—186

L. DEWAYNE RUTLEDGE, Primary Examiner

R. A. LESTER, Assistant Examiner

U.S. Cl. X.R.

29—584, 585; 148—1.5, 186